United States Patent
Abas et al.

(10) Patent No.: US 10,566,230 B2
(45) Date of Patent: Feb. 18, 2020

(54) GRIPPER FOR SEMICONDUCTOR DEVICES

(71) Applicant: SUNPOWER CORPORATION, San Jose, CA (US)

(72) Inventors: Emmanuel Chua Abas, Laguna (PH); Vergil Rodriguez Sandoval, Laguna (PH)

(73) Assignee: SunPower Corporation, San Jose, CA (US)

( * ) Notice: Subject to any disclaimer, the term of this patent is extended or adjusted under 35 U.S.C. 154(b) by 380 days.

(21) Appl. No.: 15/089,424

(22) Filed: Apr. 1, 2016

(65) Prior Publication Data
US 2017/0287766 A1  Oct. 5, 2017

(51) Int. Cl.
| | |
|---|---|
| H01L 21/683 | (2006.01) |
| B25J 15/06 | (2006.01) |
| B65G 47/91 | (2006.01) |
| H01L 21/677 | (2006.01) |
| H01L 21/687 | (2006.01) |

(52) U.S. Cl.
CPC ...... *H01L 21/6838* (2013.01); *B25J 15/0616* (2013.01); *B65G 47/91* (2013.01); *H01L 21/67712* (2013.01); *H01L 21/67778* (2013.01); *H01L 21/68771* (2013.01)

(58) Field of Classification Search
CPC .......... H01L 21/6838; H01L 21/67712; H01L 21/67778; B25J 11/0095; B25J 15/0616; B25J 15/0675; B65G 47/91; Y10S 414/141
USPC ...................................................... 294/213
See application file for complete search history.

(56) References Cited

U.S. PATENT DOCUMENTS

| | | | | |
|---|---|---|---|---|
| 4,720,130 A | * | 1/1988 | Andou | B25J 15/0616 294/907 |
| 6,024,393 A | * | 2/2000 | Shamlou | H01L 21/6838 294/907 |
| 6,244,641 B1 | * | 6/2001 | Szapucki | B25J 15/0616 294/188 |
| 6,929,299 B2 | * | 8/2005 | Halpin | H01L 21/68707 294/213 |
| 2006/0182603 A1 | | 8/2006 | Hawes | |

(Continued)

FOREIGN PATENT DOCUMENTS

| | | |
|---|---|---|
| JP | 2003142503 | 5/2003 |
| WO | WO 199950891 | 10/1999 |

OTHER PUBLICATIONS

International Preliminary Report on Patentability from PCT/US2017/024372 dated Oct. 11, 2018, 11 pgs.

*Primary Examiner* — Dean J Kramer
(74) *Attorney, Agent, or Firm* — Schwabe, Williamson & Wyatt, P.C.

(57) ABSTRACT

A wafer transfer system can include a wafer gripper for picking and placing semiconductor devices. In an embodiment, the wafer gripper can include a first portion, a second portion and a laminate between the first and second portion. In one embodiment, the first portion can comprise glass or tempered glass, where the first portion having at least one vacuum hole and is configured to receive the semiconductor device. In an embodiment, the second portion can include glass or tempered glass, the second portion having configured to use low air pressure from a closed vacuum to vacuum a wafer. In an embodiment, the laminate can bond the first portion to the second portion.

16 Claims, 8 Drawing Sheets

(56) References Cited

U.S. PATENT DOCUMENTS

| | | | |
|---|---|---|---|
| 2008/0129064 A1* | 6/2008 | Harvey | H01L 21/6838 294/64.3 |
| 2009/0293663 A1* | 12/2009 | Chang | B25J 9/0012 74/490.01 |
| 2012/0237329 A1 | 9/2012 | Lin | |
| 2013/0057008 A1* | 3/2013 | Takemura | B25J 9/0012 294/213 |
| 2015/0290815 A1* | 10/2015 | Pergande | B25J 15/0014 294/213 |
| 2016/0001449 A1* | 1/2016 | Pergande | B25J 15/0014 361/234 |
| 2016/0254176 A1* | 9/2016 | Monaco | B25J 11/0095 294/188 |

* cited by examiner

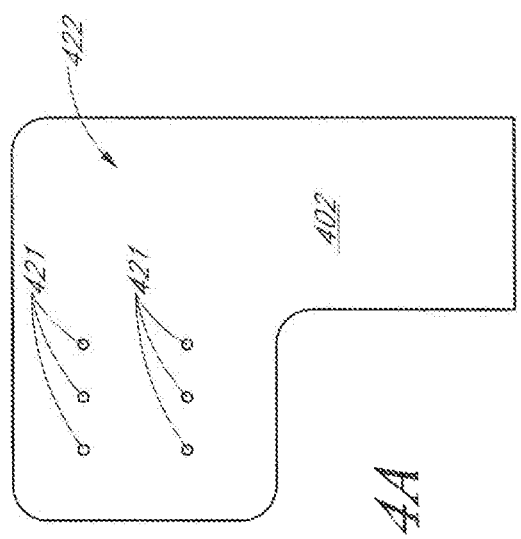
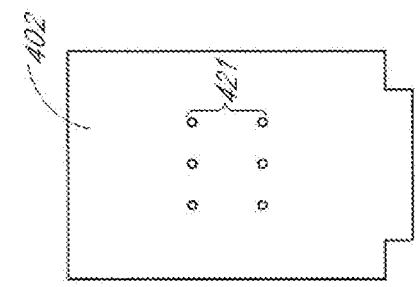
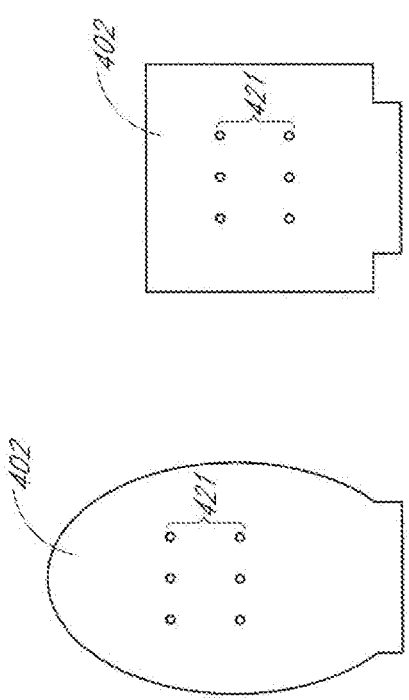
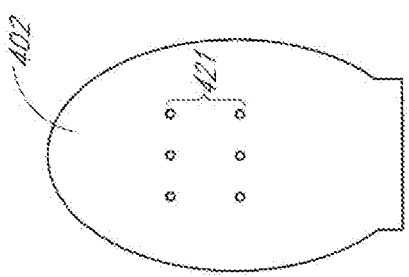
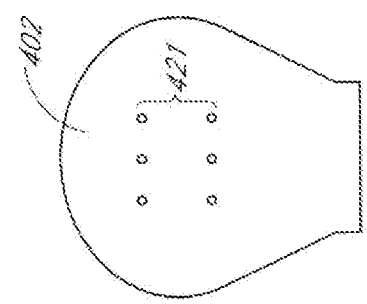

GRIPPER FOR SEMICONDUCTOR DEVICES

BACKGROUND

Semiconductor devices, for example photovoltaic (PV) cells among others, are well known electronic devices. In one example, photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

Techniques for increasing the efficiency in the manufacture of semiconductor devices, are generally desirable.

BRIEF DESCRIPTION OF THE DRAWINGS

FIGS. 4A-4E illustrate a top view of an example wafer gripper, according to some embodiments.

DETAILED DESCRIPTION

Figure 1:
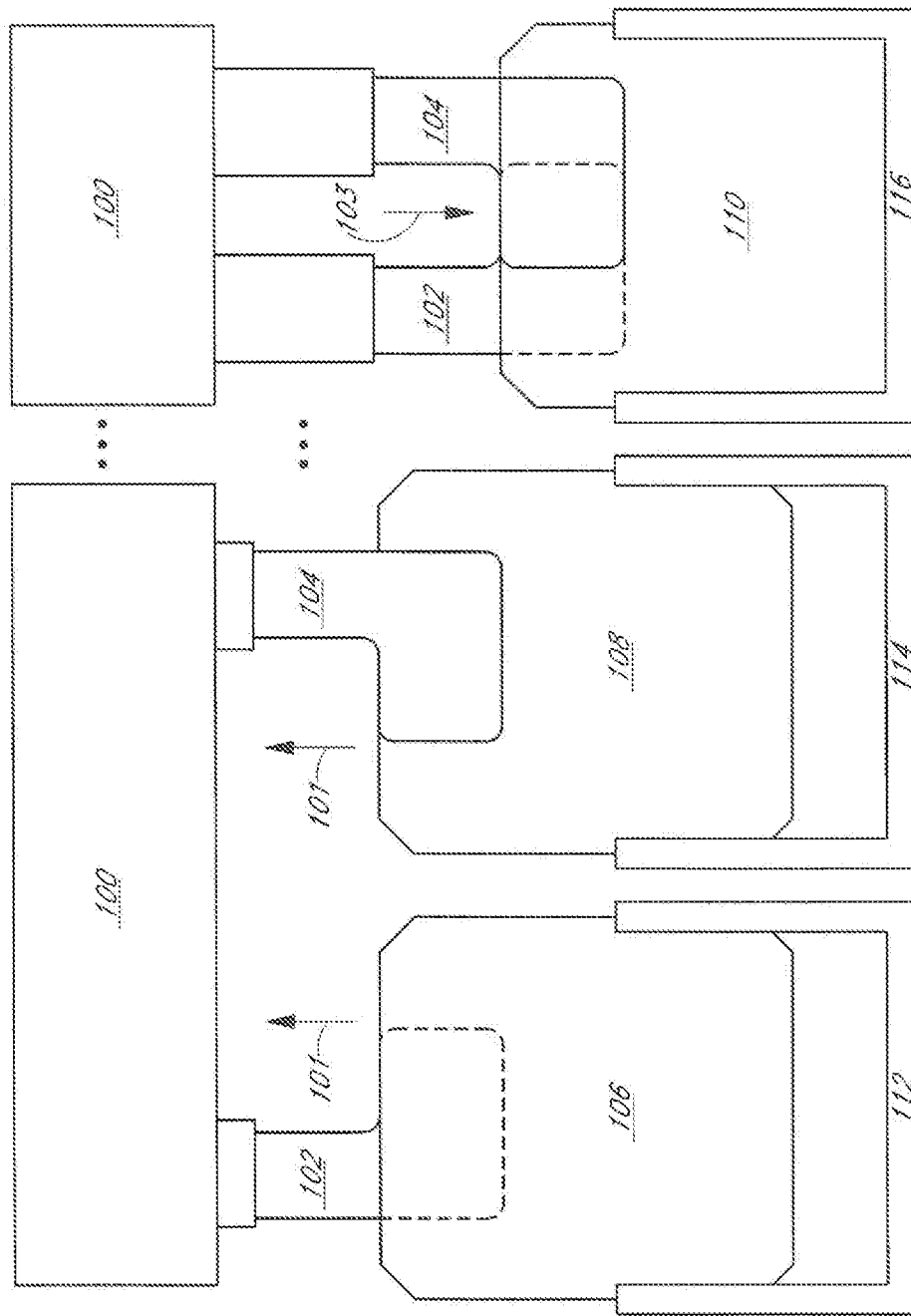
FIG. 1 illustrates a top view of an example wafer transfer system, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" wafer gripper does not necessarily imply that this wafer gripper is the first wafer gripper in a sequence; instead the term "first" is used to differentiate this wafer gripper from another wafer gripper (e.g., a "second" wafer gripper). As defined herein, a wafer gripper can be an apparatus used for picking-up and/or placing, a semiconductor device (e.g., a wafer, a silicon wafer, silicon substrate, a solar cell, among other semiconductor devices).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification describes an example wafer transfer system that includes a wafer gripper for semiconductor devices (e.g., wafers, silicon wafers, solar cells, among other semiconductor devices), followed by a more detailed description of example wafer grippers, example methods for manufacturing wafer grippers and transferring wafers using said wafer grippers. Various examples are provided throughout.

The specification describes an example wafer transfer system that includes a wafer gripper for semiconductor devices. A wafer transfer system is an apparatus configured to transfer a semiconductor device from one location to another location. A semiconductor device can be a silicon wafer or wafer, silicon substrate, solar cell, among others. In an example, a wafer transfer system can transfer wafers from one wafer cassette to another wafer cassette. A wafer cassette can be receptacle for holding wafers prior to and/or after a manufacturing process. The total throughput of a process can be limited by the number of wafers that can fit into a single wafer cassette. Thus, it can be desirable to increase the total throughput of a manufacturing process by increasing the number of wafers loaded into a wafer cassette for that process. Therefore, methods, techniques and apparatus for maximizing the number of wafers loaded into a wafer cassette can be desirable. An example, a wafer transfer system is shown in FIG. 1.

FIG. 1 illustrates an example wafer transfer system, according to some embodiments. In an embodiment, the wafer transfer system (WTS) 100 can include a first and a second wafer gripper 102, 104. In one embodiment, the WTS 100 can use the first wafer gripper 102 to pick-up 101 a first wafer 106 from a first wafer cassette 112. In an embodiment, the first wafer gripper 102 can pick-up the first wafer 106 from a first surface of the first wafer 106, as shown in FIG. 1. In some embodiments, the first wafer gripper 102 can pick-up the first wafer 106 from a second surface of the first wafer 106, where the second surface can be opposite the first surface. In one embodiment, the WTS 100 can use the second wafer gripper 104 to pick-up 101 a second wafer 108 from a second wafer cassette 114. In an embodiment, the second wafer gripper 104 can pick-up the second wafer 108 from a first surface of the second wafer 108, as shown in FIG. 1. In some embodiments, the second wafer gripper 104 can pick-up the second wafer 108 from a second surface of the second wafer 108, where the first surface can be opposite the second surface. In an embodiment, the WTS 100 can transfer wafers 106, 108 from a first and/or second wafer cassette 112, 114 to a third wafer cassette 116. In an embodiment, the third wafer cassette 116 can be a different type of wafer cassette from the first and/or second wafer cassette 106, 108. In an embodiment, the third wafer cassette 116 can be a wafer cassette configured for use in a high temperature process. In one example, the third wafer cassette can be a cassette used in a thermal process (e.g., oven, heating process). In an embodiment, the first and/or second cassette 112, 114 can be cassettes used for transferring wafers from one process to another process. In an example, the first and/or second cassette 112, 114 can be transfer cassettes.

In an embodiment, the wafer transfer system 100 can use the wafer grippers 102, 104 to place 103 the first 106, second 108 and/or a plurality of wafers 110 to the third wafer cassette 116. In some embodiments, the WTS 100 can transfer wafers from one, two or more wafer cassettes to the third wafer cassette 116. In one embodiment, the WTS 100 can be a linear WTS. In an example, a linear WTS can be a WTS that can pick wafers 106, 108 from the first and/or second cassettes 112, 114 and travel along a linear axis to place wafers 106, 108 to a third cassette 116. Although FIG. 1 shows an example linear WTS, other WTS embodiments, e.g., a non-linear WTS, can be used.

Figure 2:
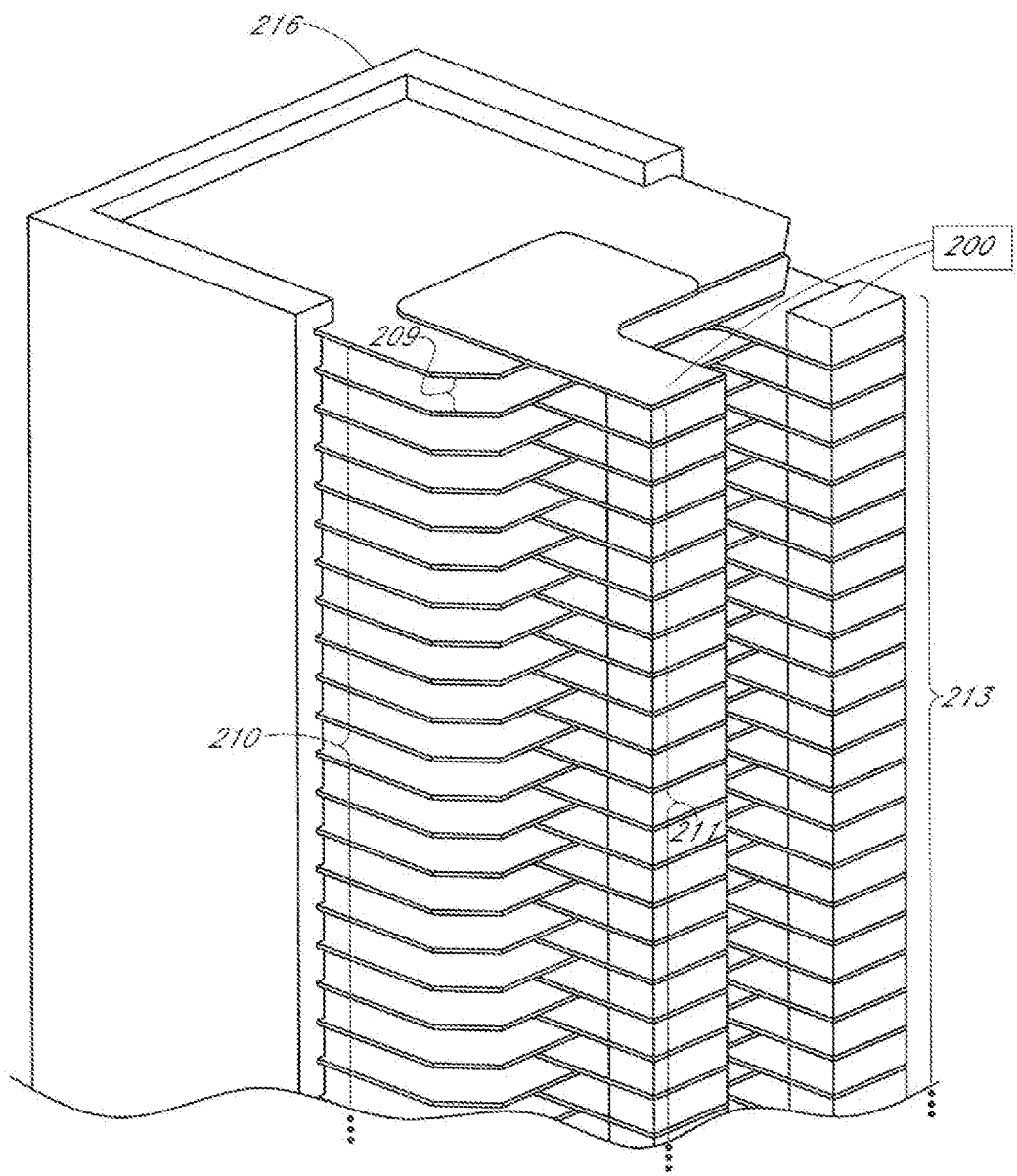
FIG. 2 illustrates a profile view of a portion of the wafer transfer system of FIG. 1, according to some embodiments.
Figure 3:
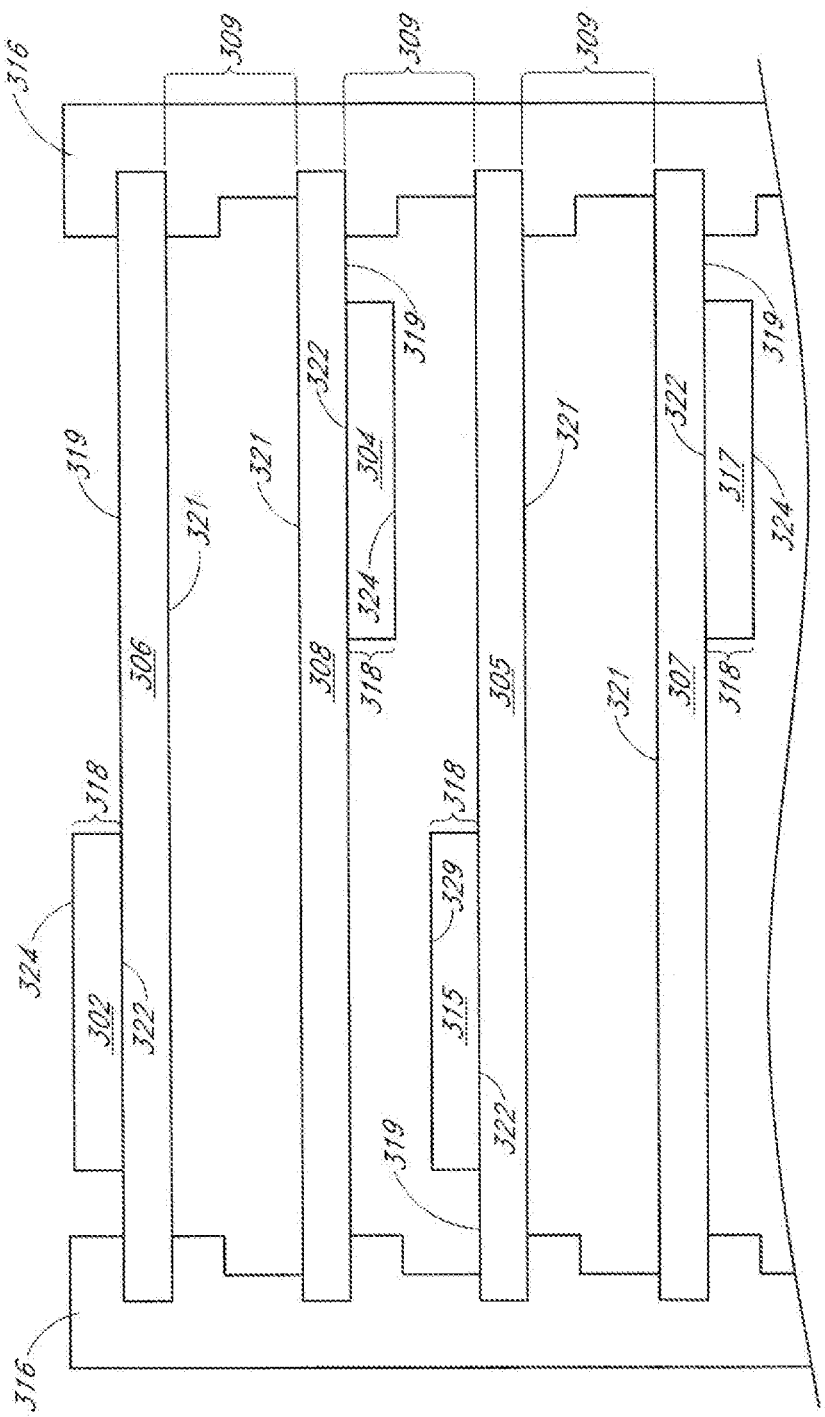
FIG. 3 illustrates a cross-sectional view of a portion of the wafer cassette of FIG. 2, according to some embodiments.

With reference to FIG. 2, there is shown a portion of the wafer transfer system of FIG. 1, according to some embodiments. As shown, the wafer transfer system 200 has similar reference numbers to elements of the wafer transfer system 100 of FIG. 1, where like reference numbers refer to similar elements throughout the figures. In an embodiment, the structure of the wafer transfer system 200 is substantially similar to the structure of the wafer transfer system 100 in FIG. 1, except as described below. Therefore the description of corresponding portions of FIG. 1 applies equally to the description of FIG. 2. In an embodiment, the wafer transfer system (WTS) 200 can include a plurality of wafer grippers 211, 213. In one embodiment, wafer grippers 211, 213 can be used to place a plurality of wafers 210 into a wafer cassette 216. One limitation to maximizing the number of wafers loaded into a wafer cassette can be the thickness of each wafer and/or a pitch of the wafer cassette. A pitch 209 of a wafer cassette can be the distance between wafers that are loaded into the wafer cassette, as shown in FIG. 2. The pitch can be dependent on the thickness of a wafer gripper. FIG. 3 illustrates a cross-sectional view of the wafer cassette of FIG. 2 showing an example of the wafer cassette pitch and wafer gripper thickness. In an embodiment, a pitch of a receiving wafer cassette can be finer (e.g., the wafers can be closer together) than a pitch of a source wafer cassette. In an example, with reference to FIGS. 1 and 2, the pitch of the wafer cassette 116/216 can be finer than the pitch of the source wafer cassettes 112, 114. Thus, provided a receiving cassette is the same size as a source cassette, in an embodiment, the receiving cassette can hold more wafers (e.g., hold double, triple the number of wafers) than a source wafer cassette.

With reference to FIG. 3, there is shown a cross-sectional view of a portion of the wafer cassette of FIG. 2, according to some embodiments. As shown, the wafer cassette 316 has similar reference numbers to elements of the wafer cassette 216 of FIG. 2, where like reference numbers refer to similar elements throughout the figures. In an embodiment, the structure of the wafer cassette 316 is substantially similar to the structure of the wafer cassette 216 in FIG. 2, except as described below. Therefore the description of corresponding portions of FIG. 2 applies equally to the description of FIG. 3. As shown, in an embodiment, a first, second, third and fourth wafer 306, 308, 305, 307 can be loaded into a wafer cassette 316. In one embodiment, each wafer 306, 308, 305, 307 can be separated from each other wafer by a pitch 309. In an embodiment, the pitch can be approximately less than or equal to 2.0 millimeters. In an example the pitch 309 can be approximately less than or equal to 1.6 millimeters. In one example, the pitch 309 can be approximately 1.5 millimeters.

To prevent wafer breakages during picking and/or placing of a wafer, wafer grippers or the wafers carried by the wafer gripper must not come into contact with one another or other wafers. In an embodiment, each wafer gripper 302, 304, 315, 317 can have a thickness 318 less than the pitch 309 to prevent each wafer gripper 302, 304, 315, 317 from contacting one another. In one example, provided a pitch of 2.0 millimeters, the wafer grippers 302, 304, 315, 317 can have a thickness 318 of approximately 1.5 millimeters. In one example, the thickness of the wafer grippers 302, 304, 315, 317 can be in the range of approximately 0.5-1.6 mm.

To pick-up a wafer from a wafer cassette or place a wafer to a wafer cassette, in an embodiment, a wafer gripper can be positioned on either a first or a second surface 319, 321 of a wafer, where the first surface 319 of the wafer is opposite the second surface 321. In an example, the first wafer gripper 302 can be positioned on the first surface 319 of the first wafer 306, as shown. In one example, the first wafer gripper 302 can instead be positioned on the second surface 321 of the first wafer 306. In an example, the second wafer gripper 304 can be positioned on the first surface 319 of the second wafer 308. In one example, the second wafer gripper 304 can instead be positioned on the second surface 321 of the second wafer 308.

In an embodiment, the wafer grippers 302, 304, 315, 317 can have a front surface 322 and a back surface 324, where the front surface 322 is opposite the back surface 324. As shown, the front surface 322 of a wafer gripper can be positioned on either a first or a second surface 319, 321, respectively, of the wafers 306, 308, 305, 307, where the first surface 319 is opposite the second surface 321. In an example, a front surface 322 of a first wafer gripper 302 can positioned on a first surface 319 a first wafer 306. In the same example, a front surface 322 of a second gripper 304 can be positioned on a first surface 319 of a second wafer 308. As shown, in the same example, picking and/or placing at least two wafers 306, 308 from the same surface (e.g., either from the first or second surfaces 319, 321) can allow for narrower pitch 309 between wafers 306, 308 at a cassette 316. Since there is no wafer gripper between the first and second wafers 306, 308 during a picking or placing process, the pitch 309 may not be limited by the thickness of the wafer gripper and thus can be made narrow (e.g., approximately less than 2.0 millimeters). In an embodiment, the wafers 306, 308 can be picked and/or placed into a wafer cassette with an orientation where either the first and/or second surfaces 319, 321 are facing each other. In an example, as shown in FIG. 3, the second surfaces 321 of the wafers 306, 308 and the wafers 305, 307 are shown to be facing each other. In one example, the front surface 322 of a first wafer gripper 302 can positioned to face the front surface 322 of a second wafer gripper 304 during a picking and/or placing process.

TABLE 1

Wafer Gripper Material Analysis

| Material | Thickness (mm) | Deflection (mm) | Manufacturability |
|---|---|---|---|
| Glass | 1.00 | 0.024 | Not difficult |
|  | 0.75 | 0.057 | Not difficult |
|  | 0.50 | 0.191 | Not difficult |
| Ceramic | 1.40 | 0.003 | Not difficult |
|  | 1.00 | 0.008 | Difficult |
|  | 0.75 | 0.018 | Difficult |
|  | 0.50 | 0.060 | Difficult |

Figure 5:
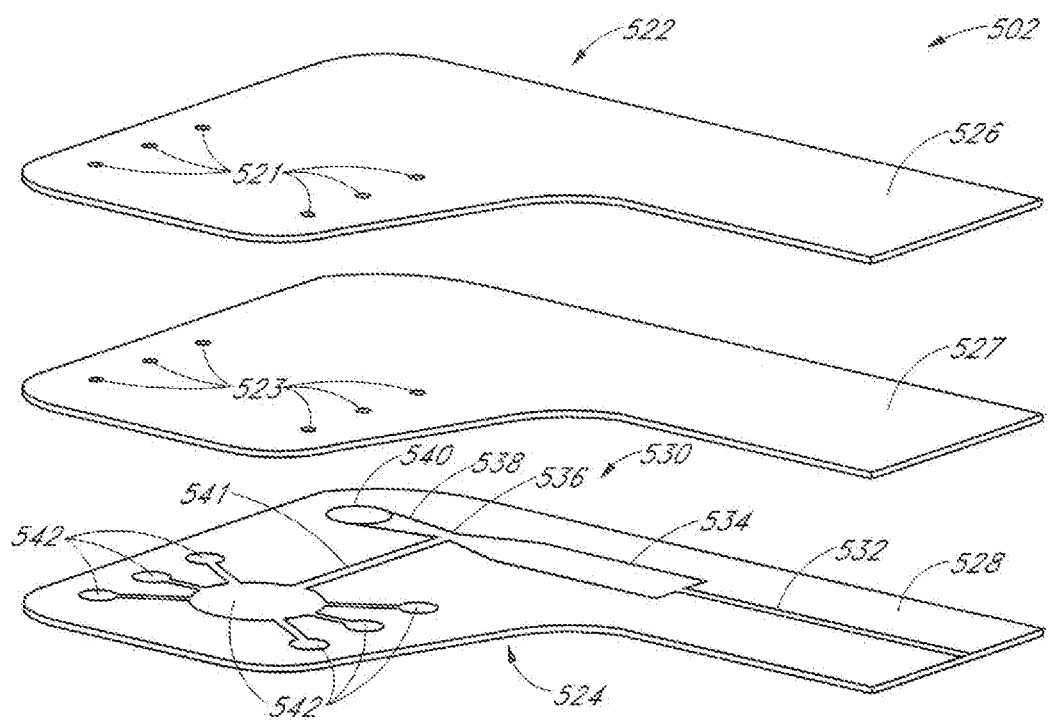
FIG. 5 illustrates a profile view of a first portion, a second portion and a laminate of an example wafer gripper, according to some embodiments.

Referring to Table 1 and corresponding to a wafer gripper shown in FIG. 4A, a simulated comparison of wafer grippers fabricated from ceramic and glass is shown, according to some embodiments. In an embodiment, Table 1 assumes the wafer gripper is configured to pick up or place a wafer having mass of approximately less than 5 grams and a wafer gripper having a shape shown in FIG. 4A. In an embodiment, as used herein, the term deflection refers to a degree a structural element is displaced under a load. In one embodiment, deflection can refer to an angle or a distance. In other instances, the terms deflection and displacement can be used interchangeably. Also, Table 1 assumes a wafer gripper configured to fit between wafer cassette pitch of 1.5 millimeters and have a resultant displacement of less than 0.26 millimeters, where 0.26 millimeter displacement is an acceptable displacement to pick up or place a wafer having mass of approximately less than 5 grams without breaking. As shown, glass or tempered glass can be an effective material to fabricate thin (e.g., within the range of 0.5-1.0 millimeters) wafer grippers. In an example, wafer grippers having a thickness of greater than 0.5 millimeters can be fabricated from glass. In an example, a thin wafer gripper can be fabricated by an engraving or etching process. In contrast, it can be challenging to fabricate a thin wafer gripper from a ceramic material. In an example, unlike glass, fabrication techniques for a ceramic wafer gripper can be difficult as ceramic material tends to get brittle and unstable at thinner thicknesses (e.g., at thickness less than or equal to 1.0 millimeter). An example wafer gripper is shown in FIGS. 4-6.

Referring to FIG. 4A, there is shown a top view of a wafer gripper, according to some embodiments. As shown, the wafer gripper 402 has similar reference numbers to elements of the wafer cassette 302 of FIG. 3, where like reference numbers refer to similar elements throughout the figures. In an embodiment, the structure of the wafer gripper 402 is substantially similar to the structure of the wafer gripper 302 in FIG. 3, except as described below. Therefore the description of corresponding portions of FIG. 3 applies equally to the description of FIG. 4A.

In an embodiment, the wafer gripper 402 can have a deflection of less than or equal to 0.10 degrees or less than or equal to 0.26 millimeters for a wafer having a mass of approximately 5 grams or less. In one example, to pick up and/or place a wafer having mass of approximately 5 grams or less, the wafer gripper 402 can include glass or tempered glass, have a thickness in the range of 0.75 millimeters and deflection of 0.046 millimeters.

In an embodiment, the wafer gripper 402 can substantially include glass or tempered glass. In one embodiment, the wafer gripper can have a thickness in the range of in the range of 0.50 to 2.0 millimeters. In an embodiment, the wafer gripper can have a thickness of at least 0.50 millimeters. In one example, the wafer gripper 402 can have a thickness of 650 microns. In one embodiment, the wafer gripper 402 can be fin shaped, as shown in FIG. 4A.

Referring to FIGS. 4B to 4E, there is shown a top view of example wafer grippers, according to some embodiments. In an example, with reference to FIGS. 4B, 4C, 4D and 4E a wafer gripper can have a circular, oblong, square and/or rectangular shape, among other shapes, respectively. In an embodiment, the wafer gripper can have other shapes not shown such as a triangular, trapezoidal or polygonal shape, among other shapes).

Referring to FIG. 5, there is shown a profile view of a first portion, a second portion and a laminate of an example wafer gripper, according to some embodiments. As shown, the wafer gripper 502 has similar reference numbers to elements of the wafer cassette 402 of FIGS. 4A-4E, where like reference numbers refer to similar elements throughout the figures. In an embodiment, the structure of the wafer gripper 502 is substantially similar to the structure of the wafer gripper 402 in FIGS. 4A-4E, except as described below. Therefore the description of corresponding portions of FIGS. 4A-4E applies equally to the description of FIG. 5. In an embodiment, the wafer gripper 502 can include a first portion 526, a second portion 528 and a laminate 527. As shown, in an embodiment, the first portion 526, second portion 528 and laminate 527 can be bonded together, e.g., using a method described in FIG. 7. In an embodiment, the wafer gripper 502 can have a front surface 522 and a back surface 524, where the front surface 522 is opposite the back surface 524.

In an embodiment, the first portion 526 can be glass or tempered glass. In one embodiment, the first portion 526 can have a plurality of vacuum holes 521. In an example, the first portion 526 can have one, two or more vacuum holes. In one embodiment, the first portion can have a thickness greater than 50 microns. In one example, the first portion can have a thickness of 300 microns.

In an embodiment, the second portion 528 can be glass or tempered glass. In an embodiment, the second portion 528 can include a vacuum 530. In an embodiment, the vacuum 530 can be a patterned region of the second portion 528, where the patterned region can be an etched, scratched and/or engraved region of the second portion 528. In an embodiment, the vacuum can also be referred to as a vacuum pattern 530. In an embodiment, the vacuum 530 can include an intake region 532, a first cavity 534, a nozzle 536, a second cavity 538, an exhaust 540 and/or a vacuum intake 541. In an embodiment, the second portion 528 can also include one or more vacuum cavities 542. In an embodiment, the intake region 532, a first cavity 534, a nozzle 536, a second cavity 538, a vacuum intake 541 and/or one or more vacuum cavities 542 can each be a cavity in the second portion 528 formed by an etching, carving and/or engraving process. In an embodiment, the exhaust 540 can be a through-hole structure. In an example, the exhaust 520 can be formed through the second portion 528 by a drilling process. In one embodiment, the second portion 528 can have a thickness greater than 200 microns. In one example, the second portion 528 can have a thickness of 300 microns.

In an embodiment, the laminate 527 can be carbon, carbon tape, capton tape or polyolefin. In some embodiments, the laminate 527 can instead be an adhesive and/or a bonding agent. In an embodiment, the laminate 527 can bond the first portion 526 to the second portion 528. In one embodiment, the laminate can have vacuum holes 523. In an embodiment, the vacuum holes 523 can be aligned concentric with the vacuum holes 521 and the vacuum cavities 541 to allow air to flow between the vacuum holes 521, 523 and vacuum cavities 542. In an embodiment, the laminate 527 can seal, close and/or cover the vacuum 530. In an embodiment, the vacuum can be a closed vacuum system. In an embodiment, a closed vacuum system can be a vacuum where air flow is limited to specific entry and/or exit points. In one embodiment, the vacuum can be configured to prevent air from entering and/or escaping except at the intake region 532, vacuum holes 523 and exhaust 540. In an example, the laminate 527 can be formed over the second portion 528 to seal the vacuum 530 and prevent air from entering and/or escaping the vacuum 530 except at the intake region 532, vacuum holes 523 and exhaust 540. In an embodiment, the laminate 527 can have a thickness of greater than 50 microns. In one example, the laminate can have a thickness of 100 microns. In some embodiments, the laminate 527 can include the vacuum 530 and at least one vacuum cavity 542, where the second portion 528 can instead be blank (e.g., not include the vacuum pattern 530 and at least one vacuum cavity 542).

In an embodiment, the first portion 526 can be configured to receive a wafer 502. In an example, during a picking process the first portion 526 can be in direct contact with a wafer. In an embodiment, the first portion 522 can be located at a front surface 522 of the wafer gripper 502. In some embodiments, the first portion can instead be located at a back surface 524 of the wafer gripper 502, where the second portion can be located at the front surface 522.

In an embodiment, the second portion 528 can be configured to use low air pressure or negative air pressure contained in the vacuum 530 to vacuum a wafer. In an example, the second portion 528 can be configured to use low air pressure contained in the vacuum 530 to pick-up or place a wafer. In an embodiment, low air pressure can be air pressure lower than standard atmospheric air pressure (14.7 psi). In an embodiment, the vacuum 530 can be a closed vacuum system, where air is limited from entering at an intake region 528 and vacuum cavities 542 and limited from exiting the vacuum 530 through the exhaust 540. In an example, the vacuum 530 from the second portion 528 can use suction to pick up a wafer using low air pressure build-up within the nozzle 541 of the vacuum 530, where the suction can be performed through the vacuum holes 521 of the first portion 526. In some embodiments, the vacuum can be a referred to as a venturi vacuum. In one embodiment, the first portion 526 can be configured to release a wafer when the vacuum form the second portion 528 is turned off.

Figure 6A:
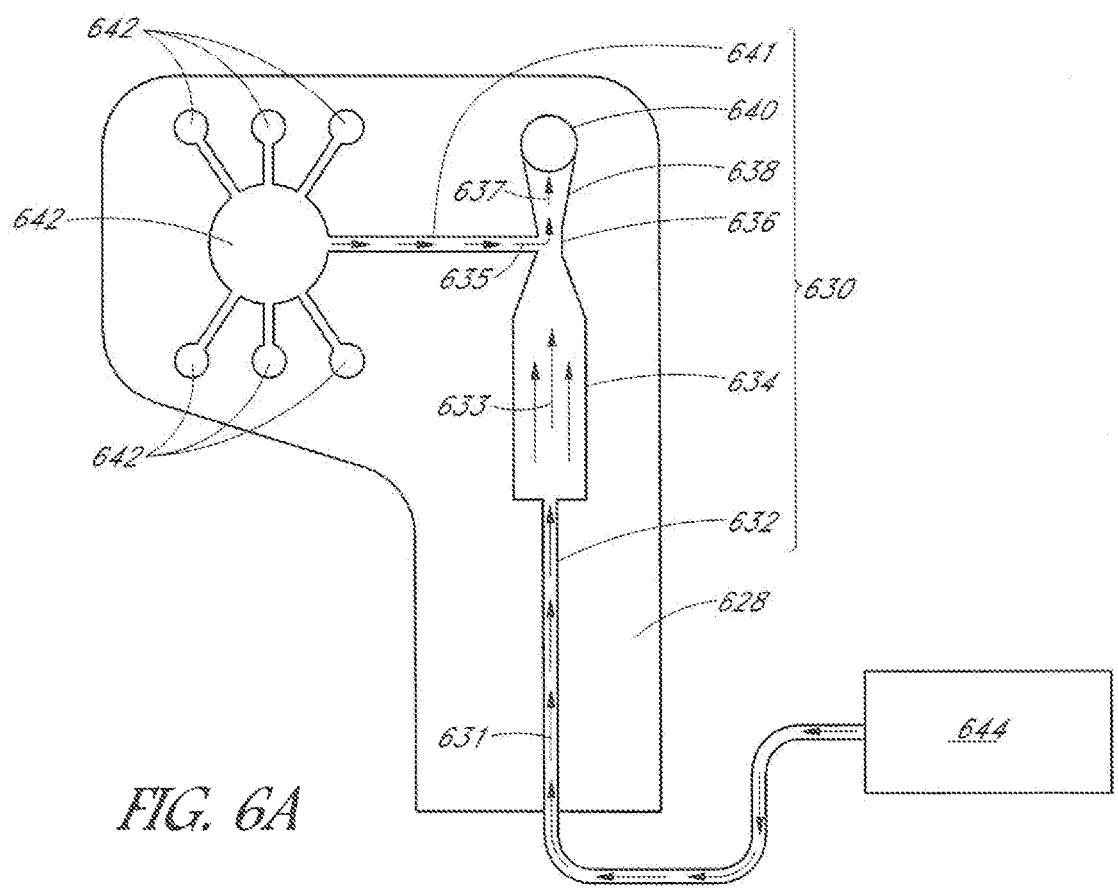
FIGS. 6A-6C illustrate a top view of example embodiments of a second portion of the wafer gripper of FIGS. 4 and 5, according to some embodiments.
Figure 6B:
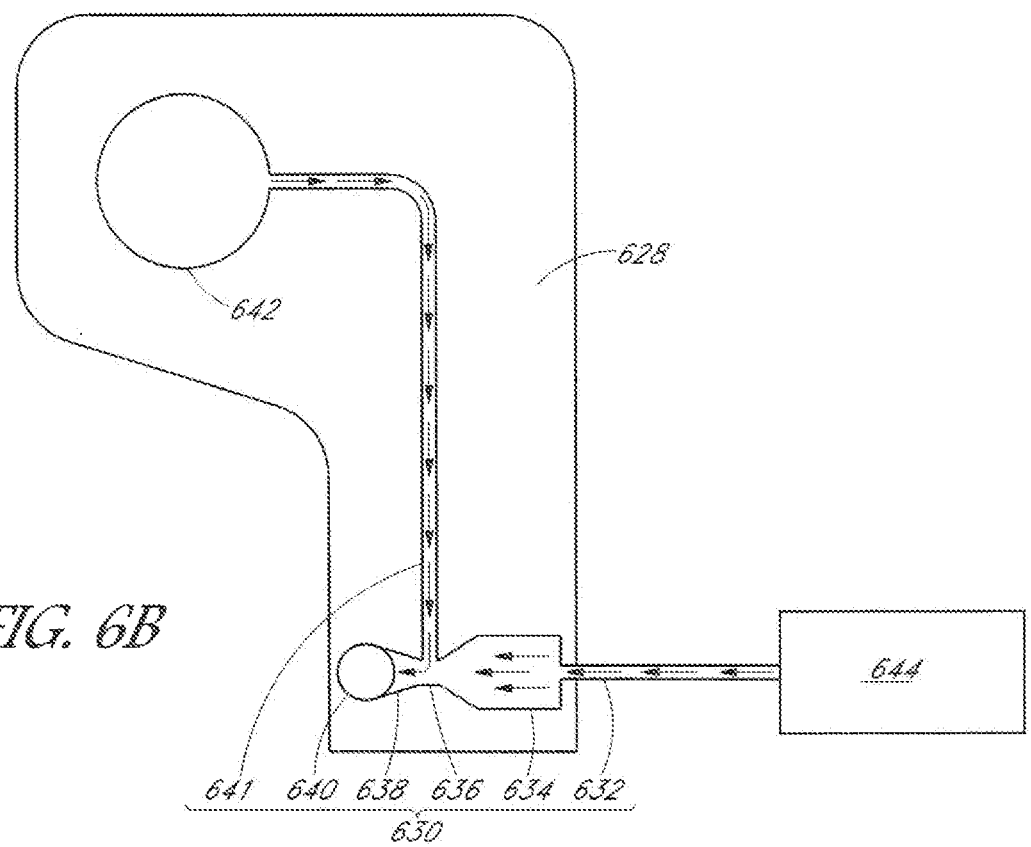
Figure 6C:
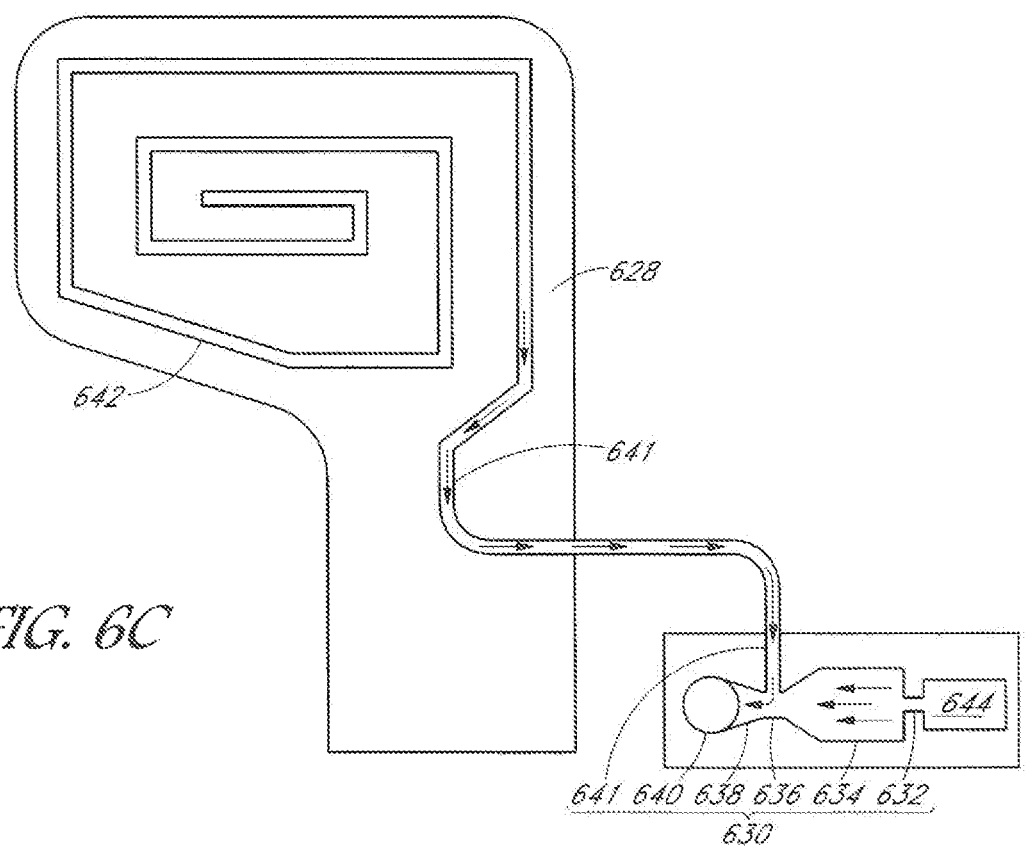

With reference to FIGS. 6A, 6B and 6C, there are shown example second portions of FIG. 5, according to some embodiments. As shown, the second portion 628 of FIGS. 6A, 6B and 6C have similar reference numbers to elements of the second portion 528 of FIG. 5, where like reference numbers refer to similar elements throughout the figures. In an embodiment, the structure of the second portion 628 of FIGS. 6A, 6B and 6C are substantially similar to the structure of the second portion 528 in FIG. 5, except as described below. Therefore the description of corresponding portions of FIG. 5 applies equally to the description of FIGS. 6A, 6B and 6C. In one example, the second portion 628 of FIG. 6A can be substantially the same, as shown, to the second portion 528 of FIG. 5. In another example, FIGS. 6B and 6C can be another embodiment of the second portion 528 of FIG. 5, where FIGS. 6B and 6C are substantially similar to the structure of the second portion 528 in FIG. 5, except as described below.

Referring to FIG. 6A, there is shown a top view of the second portion of the wafer gripper of FIG. 5, according to some embodiments. In an embodiment, the second portion 628 can include a vacuum 630. In an embodiment, the vacuum 630 can include an intake region 632, a first cavity 634, a nozzle 636, a second cavity 638, an exhaust 640, and/or a vacuum intake 641. In an embodiment, the second portion 628 can include one or more vacuum cavities 642. In an embodiment, air 631 can be fed through the intake region 632 to the first cavity 634. In an example, an air compressor 644 can feed the air 631 into the intake region 632. In an embodiment, air 633 can pass through the first cavity 634 to the nozzle 636. In an embodiment, the nozzle 636 can include a tapered structure, e.g., nozzle 636 can have width less than a width of the first cavity 634. Since the air 633 passing from the first cavity 632 to the nozzle 636 is constricted at the nozzle 636, the speed of the air 637 exiting the nozzle 636 can be faster than the speed the air 633 entering the nozzle 636. Thus, in an embodiment, the speed of the air 637 exiting the nozzle 636 can be increased and can result in a lower air pressure at the second cavity 638 as compared to air pressure of the surrounding air outside of the vacuum 630. In an embodiment, low air pressure can be air pressure lower than standard atmospheric air pressure (14.7 psi). In an embodiment, air 635 can enter at the nozzle 636 due to a vacuum effect at the vacuum cavities 642 and due to the low air pressure at the second cavity 638 of the vacuum 630. In an embodiment, the air 637 can exit through and exhaust 640 from the second cavity 638. Thus, in an embodiment, the second portion 628 can be configured to use low air pressure contained in the vacuum 530 to vacuum a wafer. In one example, the second portion 628 can be configured to use low air pressure contained in the vacuum 530 to pick-up or place a wafer.

Although FIG. 6A shows one embodiment for the second portion 528 of FIG. 5, other embodiments can be used, where FIGS. 6B and 6C show alternative embodiments of the second portion 528 of FIG. 5. It can be appreciated though that the present disclosure is not limited to the embodiments shown.

Referring to FIG. 6B, there is shown a top view of another example of the second portion of the wafer gripper of FIG. 5, according to some embodiments. As shown, the vacuum 630 of FIG. 6B can be located at an edge portion of the second portion 628, in contrast to the vacuum 630 of FIG. 6A and/or the vacuum 530 of FIG. 5. In an embodiment, the vacuum 630 can be located at any other location on the second portion 628, were the present disclosure is not limited to the embodiments shown.

Referring to FIG. 6C, there is shown a top view of still another example of the second portion of the wafer gripper of FIG. 5, according to some embodiments. As shown, the vacuum 630 of FIG. 6C can be externally located from the second portion 630, in contrast to the vacuum 630 of FIG. 6A, 6C and/or vacuum 530 of FIG. 5. In an embodiment, the vacuum cavity 642 and the intake region 641 can be the only components on the second portion, where the vacuum 630 can be located externally. As shown, the vacuum 630 and air compressor 644 can be located together. In some embodiments, the vacuum 630 and the air compressor 644 can be separate (e.g., be contained in separate components from the second portion 628 of FIG. 6C).

With reference to FIGS. 6A, 6B and 6C, example vacuum cavities are shown, according to some embodiments. In an embodiment, referring to FIGS. 6A and 6B, one vacuum cavity 642 shown in FIG. 6B in contrast to a plurality of vacuum cavities 642 shown in FIG. 6A. In one embodiment, the vacuum cavity 642 can have a circular, oblong, triangular, rectangular, trapezoidal and/or polygonal shape, among other shapes. In one example, the vacuum cavity 642 can have a circular shape as shown in FIG. 6B. In some embodiments, the vacuum cavity 642 can form a spiral pattern as shown in FIG. 6C, among other patterns.

Although various embodiments for portions and/or components of a wafer gripper are shown in FIGS. 6A, 6B and 6C, there are no limitations to the combinations that can be used together and/or separately of embodiments shown. In an example, the vacuum cavity 642 of FIG. 6C can be used with the second portion 628 of FIG. 6A. In an example, the vacuum 630 of FIG. 6B can be used with the plurality of vacuum cavities 642 shown in FIG. 6A.

Figure 7:
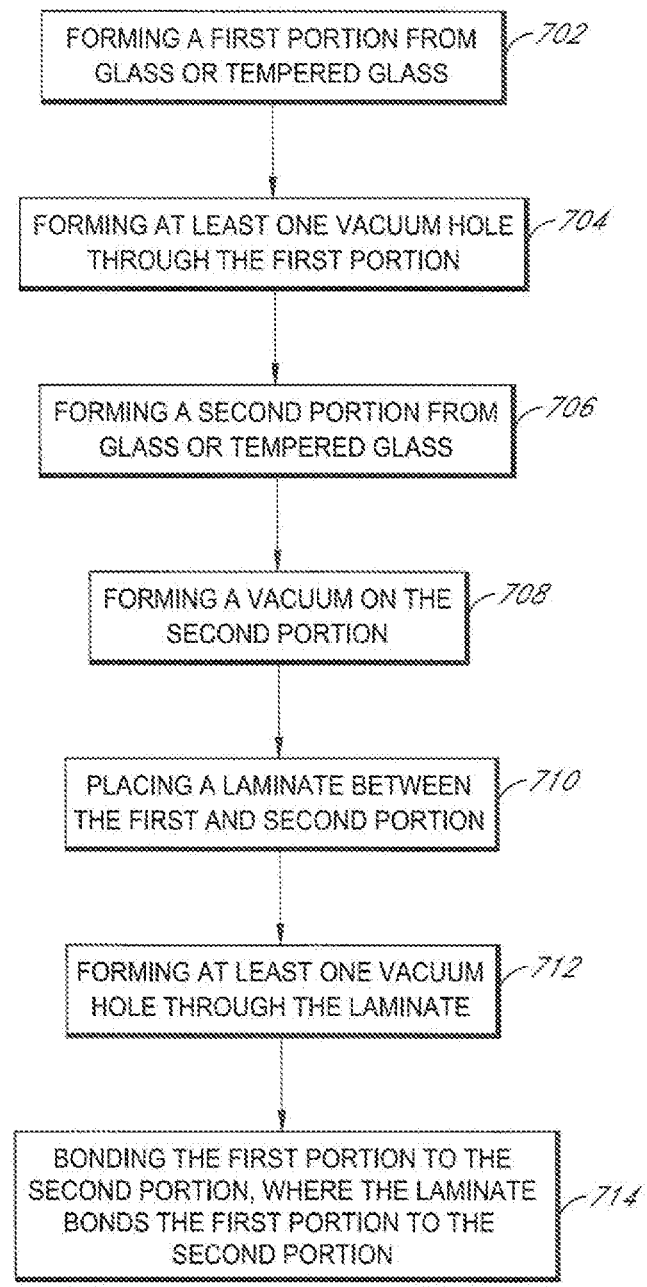
FIG. 7 illustrates a flowchart representation of a method for manufacturing a wafer gripper, according to some embodiments

Turning now to FIG. 7, a flowchart 700 illustrating a method for manufacturing a wafer gripper is shown, according to some embodiments. In various embodiments, the method of FIG. 7 can include additional (or fewer) blocks than illustrated. For example, in some embodiments, forming at least one vacuum hole through a first portion of the wafer gripper, at block 704 may not be performed, where the first portion can be provided with vacuum holes pre-formed.

At 702, a first portion of a wafer gripper can be formed from glass or tempered glass. In an embodiment, the first portion can be formed by cutting (e.g., using a glass cutter) the first portion from a sheet of glass or tempered glass. In an example, a diamond tipped cutter can be used to cut the first portion from the sheet of glass or tempered glass. In one embodiment, the first portion can be formed by performing an etching process on the glass or tempered glass.

At 704, at least one vacuum hole can be formed through the first portion of the wafer gripper. In an embodiment, a drilling process can be performed to form at least one vacuum hole. In some embodiments, one, two or more vacuum holes can be formed. In an embodiment, the forming of at least one vacuum hole can include aligning a vacuum hole to a vacuum cavity formed in a second portion of the wafer gripper. In an example, the vacuum hole can be formed to align concentrically with the vacuum cavity. In an embodiment, forming the vacuum hole 704 need not be performed, where the first portion can be provided with vacuum holes pre-formed.

At 706, a second portion of a wafer gripper can be formed from glass or tempered glass. In an embodiment, the second portion can be formed by cutting, e.g., using a glass cutter, the second portion from glass or tempered glass. In an example, a diamond tipped cutter can be used to cut the second portion from the sheet of glass or tempered glass. In one embodiment, the second portion can be formed by performing an etching process on the glass or tempered glass.

At 708, a vacuum can be formed on the second portion of the wafer gripper. In an embodiment, a venturi vacuum can be formed on the second portion of the wafer gripper. In an embodiment, an engraving and/or etching process can be performed to form the vacuum. In an embodiment, forming the vacuum can include forming an intake region, a first cavity, a nozzle, a second cavity, an exhaust and/or a vacuum intake. In an embodiment, a drilling process can be performed to form the exhaust through the second portion. In some embodiments, one, two or more vacuum cavities can be formed. In an embodiment, forming of at least one vacuum cavity can include aligning a vacuum cavity to a vacuum hole formed in the first portion of the wafer gripper. In an example, the vacuum cavity can be formed to align concentrically with the vacuum hole. In some embodiments, forming the vacuum at block 708 can instead include forming the vacuum on a laminate, where the second portion can be blank (e.g., not have a vacuum).

At 710, a laminate can be placed between the first and second portion. In an embodiment, prior to placing the laminate, the laminate can be cut to fit the shape of the first and second portions. In an embodiment, the laminate can be carbon, carbon tape, capton tape or polyolefin, among other laminates. In an embodiment, the laminate can be an adhesive and/or a bonding agent. In an example, a solid or liquid adhesive can be used. In an embodiment, a liquid adhesive can be deposited between the first and second portion to form the laminate.

At 712, at least one vacuum hole can be formed through the laminate. In an embodiment, a drilling process can be performed to form at least one vacuum hole. In some embodiments, one, two or more vacuum holes can be formed. In an embodiment, forming of at least one vacuum hole can include aligning a vacuum hole to a vacuum cavity formed in a second portion of the wafer gripper. In an example, the vacuum hole can be formed to align concentrically with the vacuum cavity. In an embodiment, forming of at least one vacuum hole in the laminate can include aligning a vacuum hole to at least one vacuum hole formed in a first portion of the wafer gripper. In an example, the vacuum hole of the laminate can be formed to align concentrically with the vacuum hole of the first portion. In an embodiment, at least one vacuum hole of the first portion and at least one vacuum hole of the laminate can be formed in the same process (e.g., the same drilling process). In an embodiment, forming the vacuum hole 712 need not be performed, where the laminate can be provided with vacuum holes pre-formed. In some embodiments, forming the vacuum hole 712 need not be performed, where the laminate can instead include a vacuum and vacuum cavities.

At 714, the first portion and second portion can be bonded together. In an embodiment, a compression and/or heating process can be performed to bond the first portion to the second portion. In an embodiment, the laminate can bond the first portion to the second portion. In an example, the laminate used can include an adhesive (e.g., carbon tape, capton tape or polyolefin), used to bond the first portion to the second portion. In an embodiment, the laminate can be an adhesive and/or a bonding agent. In an example, a solid or liquid adhesive can be used. In an embodiment, the bonding can include a heating and/or thermal process to bond the first portion to the second portion. In an example, the laminate can be heated to bond the first portion to the second portion.

In an embodiment, the wafer grippers disclosed in FIGS. 1-6 are example wafer grippers which can be formed from the method of FIG. 7.

Figure 8:
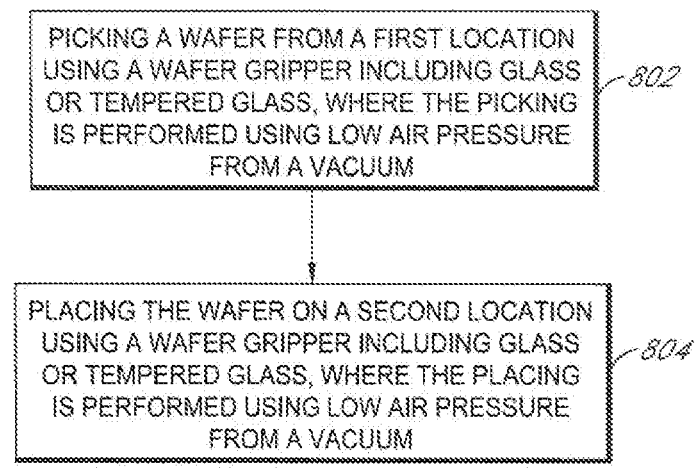
FIG. 8 illustrates a flowchart representation of a method of transferring a wafer, according to some embodiments

With reference to FIG. 8, a flowchart illustrating a method for transferring a wafer from a first location to a second location is shown, according to some embodiments.

At 802, a wafer can be picked from a first location using a wafer gripper including glass or tempered glass. In an embodiment, the wafer gripper can use a vacuum to pick up the wafer from a first location. In an embodiment, the wafer gripper can have a thickness of at least 0.5 millimeters. In an embodiment, picking the wafer can include picking a semiconductor device (e.g., a silicon wafer, silicon substrate, solar cell, etc.) from a first location. In an embodiment, the first location can be a first wafer cassette. In an embodiment, the picking can be performed using low air pressure from a vacuum. In an embodiment, the vacuum can be included in the wafer gripper or located externally. In an embodiment, the vacuum can use low air pressure to provide suction to the wafer gripper. In an embodiment, the suction can be used to pick up the wafer. In an embodiment, the vacuum can be closed, where air is limited from entering and exiting the vacuum at specific portions of the vacuum.

At 804, the wafer gripper can be placed using a wafer gripper including glass or tempered glass. In an embodiment, the wafer gripper can use a vacuum to place the wafer to a second location. In an embodiment, the wafer gripper can have a thickness of at least 0.5 millimeters. In an embodiment, the placing can be performed by removing low air pressure from a vacuum. In an embodiment, the vacuum can be included in the wafer gripper. In an embodiment, the vacuum can use low air pressure to provide suction to the wafer gripper. In an embodiment, the suction can turned off to place the wafer on a specified location. In an embodiment, the vacuum can be closed, where air is limited from entering and exiting the vacuum a specific portions of the vacuum. In an embodiment, placing the wafer can include placing a semiconductor device (e.g., a silicon wafer, silicon substrate, solar cell, etc.) to a second location. In an embodiment, the second location can be a second wafer cassette. In one embodiment, the second wafer cassette can have a pitch (e.g., distance between loaded wafers in the cassette) of less than or equal to 1.5 millimeters.

In an embodiment, the wafer grippers of FIGS. 1-6 are example wafer grippers which can be used in the method of FIG. 8.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A wafer gripper for semiconductor substrates, comprising:
   a first portion configured to receive a wafer, the first portion comprising glass or tempered glass, wherein the first portion includes at least one vacuum hole;
   a second portion having a vacuum pattern comprising:
      an air intake region;
      a first cavity connected to the air intake region, wherein the first cavity has a width greater than the air intake region;
      a nozzle, wherein the first cavity is connected to the nozzle through a tapered portion of the first cavity;
      at least one vacuum cavity axially aligned with the at least one vacuum hole, wherein the at least one vacuum cavity is connected to the nozzle through a vacuum intake region; and
      a second cavity configured to use low air pressure contained in a closed vacuum to pick-up or place a wafer, wherein the second cavity is connected to the nozzle through a tapered portion of the second cavity, the tapered portion of the second cavity opposite the tapered portion of the first cavity, an exhaust connected to the second cavity, and wherein the second portion comprises glass or tempered glass; and
   a laminate located between the first and second portions, wherein the laminate couples the first portion to the second portion, wherein the laminate comprises one or more openings axially aligned with the at least one vacuum hole of the first portion and axially aligned with the at least one vacuum cavity of the second portion, and wherein the first portion, the laminate, and the second portion have a same outer perimeter shape from a plan view perspective, and wherein outer perimeters of each of the first portion, the laminate, and the second portion are in alignment with one another.

2. The wafer gripper of claim 1, wherein the at least one vacuum hole is aligned concentrically to the at least one vacuum cavity.

3. The wafer gripper of claim 1, wherein the wafer gripper has a deflection of less than 0.10 degrees.

4. The wafer gripper or claim 1, wherein the first portion has a thickness greater than or equal to 50 microns.

5. The wafer gripper of claim 1, wherein the second portion has a thickness greater than or equal to 200 microns.

6. The wafer gripper of claim 1, wherein the wafer gripper has a thickness of at least 0.50 millimeters.

7. The wafer gripper of claim 1, wherein the laminate comprises a material selected from the group consisting of carbon, carbon tape, capton tape and polyolefin.

8. The wafer gripper of claim 1, wherein the wafer gripper comprises a shape selected from the group consisting of a fin, circular, oblong, triangular, square, rectangular, triangular, trapezoidal and polygonal shape.

9. A wafer gripper for semiconductor substrates, comprising:
   a first portion comprising glass or tempered glass, wherein the first portion includes at least one vacuum hole;
   a second portion having a vacuum pattern comprising:
     an air intake region;
     a first cavity connected to the air intake region, wherein the first cavity has a width greater than the air intake region;
     a nozzle having a width less than the width of the first cavity, wherein the first cavity is connected to the nozzle through a first tapered portion;
     at least one vacuum cavity axially aligned with the at least one vacuum hole, wherein the at least one vacuum cavity is connected to the nozzle through a vacuum intake region; and
     a second cavity connected to the nozzle through a tapered portion of the second cavity, the tapered portion of the second cavity opposite the tapered portion of the first cavity, an exhaust connected to the second cavity, and
   wherein the second portion comprises glass or tempered glass; and
   a laminate located between the first and second portions, wherein the laminate couples the first portion to the second portion, wherein the laminate comprises one or more openings axially aligned with the at least one vacuum hole of the first portion and axially aligned with the at least one vacuum cavity of the second portion, and wherein the first portion, the laminate, and the second portion have a same outer perimeter shape, and wherein outer perimeters of each of the first portion, the laminate, and the second portion are in alignment with one another.

10. The wafer gripper of claim 9, wherein the at least one vacuum hole is aligned concentrically to the at least one vacuum cavity.

11. The wafer gripper of claim 9, wherein the wafer gripper has a deflection of less than 0.10 degrees.

12. The wafer gripper or claim 9, wherein the first portion has a thickness greater than or equal to 50 microns.

13. The wafer gripper of claim 9, wherein the second portion has a thickness greater than or equal to 200 microns.

14. The wafer gripper of claim 9, wherein the wafer gripper has a thickness of at least 0.50 millimeters.

15. The wafer gripper of claim 9, wherein the laminate comprises a material selected from the group consisting of carbon, carbon tape, capton tape and polyolefin.

16. The wafer gripper of claim 9, wherein the wafer gripper comprises a shape selected from the group consisting of a fin, circular, oblong, triangular, square, rectangular, triangular, trapezoidal and polygonal shape.

* * * * *